United States Patent [19]

Twigg et al.

[11] Patent Number: 5,525,538
[45] Date of Patent: Jun. 11, 1996

[54] METHOD FOR INTRINSICALLY DOPED III-A AND V-A COMPOUNDS

[75] Inventors: Mark E. Twigg, Falls Church; Mohammad Fatemi, McLean, both of Va.; Bijan Tadayon, Germantown, Md.

[73] Assignee: The United States of America as represented by the Secretary of the Navy, Washington, D.C.

[21] Appl. No.: 400,735

[22] Filed: Mar. 8, 1995

Related U.S. Application Data

[62] Division of Ser. No. 226,586, Apr. 12, 1994, Pat. No. 5,419,785.

[51] Int. Cl.$^6$ ............................................. H01L 21/203
[52] U.S. Cl. ..................... 437/105; 437/107; 437/133; 437/174; 117/84; 117/94; 117/104
[58] Field of Search ..................... 437/105, 107, 437/132, 133, 174; 117/84, 94, 104; 148/DIG. 65, DIG. 56, DIG. 3, DIG. 4

[56] References Cited

U.S. PATENT DOCUMENTS 5,281,543  1/1994  Fukuzawa et al. ..................... 437/107
5,306,662  4/1994  Nakamura et al. ..................... 437/107

OTHER PUBLICATIONS

Mahalingam et al. "J. Vac. Sci. & Tech. B 9(4), Jul./Aug. 1991, pp. 2328–2332".

*Primary Examiner*—R. Bruce Breneman
*Assistant Examiner*—Ramamohan Rao Paladugu
*Attorney, Agent, or Firm*—Thomas E. McDonnell; George A. Kap

[57] ABSTRACT

An amorphous compound is changed to single crystal structure by heating at an elevated temperature in an inert atmosphere or in an atmosphere of a forming gas, the amorphous compound is composed of at least one Group III-A element of the Periodic Table and at least one Group V-A element, the amorphous compound having an excess over stoichiometric amount of at least one Group V-A element. The single crystal phase compound, intrinsically doped with at least one element from Group V-A, has the properties of high conductivity for a semiconductor without using any extrinsic dopant and a non-alloyed ohmic contact with a metal.

8 Claims, No Drawings

METHOD FOR INTRINSICALLY DOPED III-A AND V-A COMPOUNDS

This application is a division of application Ser. No. 08/226,556, filed Apr. 12, 1994, U.S. Pat. No. 5,419,789.

FIELD OF INVENTION

This invention pertains to conversion of amorphous compounds to single phase crystalline material and to the crystalline compounds so produced.

BACKGROUND OF INVENTION

Compounds of Groups III-A and V-A elements of the Periodic Table can be prepared in many different ways including molecular beam epitaxy, metal organic chemical vapor deposition, liquid phase epitaxy, ion implantation, and others. The first three are epitaxial whereas the fourth is not. Molecular beam epitaxy (MBE) is often used for growing or preparing the compounds.

Preparation of the compounds can be done at a high temperature range, middle temperature range, and low temperature range. The compounds prepared at a high temperature range are also referred to herein as high range compounds which are characterized by single crystal structure. The compounds prepared at a middle temperature range are also referred to herein as mid range compounds which are characterized by single crystal structure with a larger lattice parameter than is obtained at the high temperature range. The compounds prepared at a low temperature are also referred to herein as low range compounds which are characterized by amorphous structure. For gallium arsenide, the best known of the Groups III-A and V-A compounds, the high temperature range is above about 340° C., the middle temperature range is in the approximate range of 215–340° C., and the low temperature range is below about 215° C.

Prior to this development, amorphous gallium arsenide was not desirable because of its poor electrical properties.

The most important use of gallium arsenide is as a semiconductor. For certain applications and to be useful as a semiconductor, gallium arsenide has single crystal structure and high electrical conductivity.

OBJECTS AND SUMMARY OF THE INVENTION

An object of this invention is the conversion of amorphous compounds of Groups III-A and V-A elements to the crystalline phase by means of heat treatment.

Another object of this invention is the heat treatment of amorphous compounds of Groups III-A and V-A elements to form single crystal compounds that are doped by virtue of an excess of Group V-A element.

Another object of this invention is the preparation of single crystal compounds of Groups III-A and V-A elements capable of good non-alloyed, ohmic contact to a metal and devoid of disadvantages associated with extrinsic doping.

Another object of this invention is the preparation of single crystal compounds of Groups III-A and V-A elements rich in Group V-A element, having one peak in rocking curves and having precipitates of at least one Group V-A element at the interface with a substrate on which it is deposited.

Another object of this invention is the preparation of single crystal compounds of Groups III-A and V-A elements which have high electrical conductivity.

Another object of this invention is whitish but dull single crystal gallium arsenide having conductivity that is higher than single crystal gallium arsenide grown by MBE at a temperature above about 340° C.

Another object of this invention is a process of growing by MBE amorphous gallium arsenide and then heat treating it to convert the amorphous gallium arsenide to one having single crystal structure.

These and other objects of this invention are accomplished by growing amorphous compounds of Groups III-A and V-A elements and then heat treating the amorphous compounds at an elevated temperature to convert them to single crystal semiconductor compounds which have high electrical conductivity.

DETAILED DESCRIPTION OF INVENTION

The Group III-A elements contemplated herein include aluminum, gallium, indium, and thallium, especially aluminum and gallium. The Group V-A elements contemplated herein include phosphorous, arsenic, antimony and bismuth, especially arsenic and antimony. Any one or more elements of Group III-A can be combined with any one or more elements of Group V-A to form the various high conductivity compounds disclosed herein. About 50% on atomic basis of one or more elements from Group III-A is combined with about 50% on atomic basis of one or more elements from Group V-A to form the amorphous compound. Examples of such compounds are AlGaAs, GaAs, InGaAs, and AlGaSbAs.

The amorphous compounds of Groups III-A and V-A elements can be grown by the well known molecular beam epitaxy (MBE) technique at ultrahigh vacuum on the order of $10^{-10}$ Torr, which is essentially vacuum. Molecular beam epitaxy is a vacuum evaporation technique which produces compounds with a purity of better than 10 ppb. Pursuant to this procedure, molecular beams of at least one Group III-A element and at least one Group V-A element are generated by thermal sources arranged around a heated, single crystal substrate. The vaporized elements deposited on the substrate interact or react on the substrate to produce a monolayer at a time of the amorphous compound having the same composition as the film one is attempting to grow. The suitable substrates can be any single crystal compounds of Groups III-A and V-A elements. Substrate temperature for each compound is chosen so that films of desired composition are obtained. Rotation of the substrate at a rate below about 10 rpm greatly facilitates uniformity in composition and thickness of the film. A thermocouple is attached to the backside of the substrate to measure temperature of the substrate. It is this thermocouple temperature which is indicative of the temperature at which the various films are grown. A high efficiency foil heater at the backside of the substrate provides energy for heating the substrate.

Amorphous compounds of at least one Group III-A element and at least one Group V-A element can be prepared by MBE at substrate temperatures which produce amorphous compounds. By controlling substrate temperature, one can control the kind of a product deposited on the substrate - amorphous or crystalline. Increasing the substrate temperature promotes the formation of crystalline products whereas decreasing the substrate temperature promotes the formation of amorphous products. A diffraction pattern recorded on a transmission electron microscope which shows a series of diffuse concentric circles identifies an amorphous product whereas a diffraction pattern characterized by spots arranged in concentric circles identifies a polycrystalline product. As for polycrystalline and single crystal products, a polycrystalline product has a number of crystal orientations whereas a single crystal product has only one crystal orientation throughout.

Substrate temperature for making amorphous, i.e., low range, compounds of Groups III-A and V-A elements by the MBE process should be in the approximate range of room temperature to 300° C., preferably 100 to 250° C. Mid range, i.e., single crystal compounds, are produced at higher substrate temperatures than the low range compounds and have more than 50%, on atomic basis, of one or more elements of Group V-A. High range or single crystal compounds are produced at still higher substrate temperatures and have about 50% of at least one element from Group III-A and about 50% of at least one element from Group V-A of the Periodic Table.

The rate of depositing an amorphous compound on a substrate should be in the approximate range of 0.1–10, preferably 0.5–5 microns per hour. Amorphous compounds are deposited on substrates in the form of films ranging in thickness from about 0.01 micron to about 10 microns, preferably 0.1–2 microns, although the thickness can be more or less depending in the thickness desired.

An amorphous compound of Groups III-A and V-A elements is annealed or heated at a higher temperature than the substrate temperature at which it is produced to convert it to a single crystal phase. The annealing step referred to herein can be carried out in an inert, or non-reactive atmosphere or in an atmosphere containing less than 20% preferably less than about 10%, by volume, of a reducing gas. The annealing temperature and duration should be sufficiently high and long to convert the amorphous compound to a single crystal compound. The annealing temperature should be in excess of about 500° C., preferably 600–1000° C. Annealing should take place over a time period of between 1 second (at a high temperatures) and 10 hours (at a low temperatures), and most typically is done for about 1 minute to about 1 hour. If the anneal temperature is too low, conversion to a crystalline phase is not attained regardless of anneal duration. If the anneal temperature is too high, the sample dissociates even with an overpressure of an element of Group V-A.

The annealed compound of at least one Group III-A element and at least one Group V-A element is a single crystal compound which contains precipitates of one or more Group V-A elements at its interface with the substrate on which it was deposited. The precipitates are typically present in the lowermost 50%, preferably in the lowermost 25% of the thickness of the layer of the grown and annealed compound. The volume fraction of precipitated element(s) of Group V-A is in the approximate range of 0.001–0.5%, preferably 0.05–0.2%.

The low range annealed compound of this invention has the property of being able to easily establish non-alloy, ohmic contact with a metal. This property enables the material to have a good metal contact without subjecting the material to an alloying procedure which involves subjecting the metal to an elevated temperature of about 300°–400° C. for a period of about a minute. The low range annealed compound also has very high conductivity for a semiconductor due to, inter alia, intrinsic doping with at least one element of Group V-A which obviates the need for extrinsic doping.

The low range, single crystal compounds of Groups III-A and V-A elements have higher conductivity when compared to undoped mid range and undoped high range compounds of Groups III-A and V-A elements. Conductivity of the low range, single crystal compounds of Groups III-A and V-A elements have conductivities in the approximate range of 0.1–1000/ohm-cm, preferably in the range of about 10–200/ohm-cm. These compounds can be used for most applications as grown on ordinary substrates. If necessary, the substrate can be removed by known techniques.

In reference specifically to gallium arsenide, a preferred compound of Groups III-A and V-A elements, amorphous gallium arsenide compound can be grown by molecular beam epitaxy in the form of a film on a single crystal gallium arsenide substrate at a substrate temperature below about 215° C., preferably in the approximate range of 100°–200° C., at a rate of about 0.1–10 microns/hr, preferably 0.5–5 microns/hr. Amorphous gallium arsenide is grown on a substrate in the form of a film by vaporizing gallium and arsenic in separate furnaces of an MBE apparatus and directing the vaporized gallium and arsenic at the substrate. The thickness of these grown films is on the order of 0.01–10 microns, preferably in the approximate range of 0.1–2 microns, although it can be more or less depending on the thickness desired.

The rate of gallium and arsenic deposition can be obtained from flux curves, which are plots of oven temperature on the x-axis and flux or monolayers of gallium arsenide on the y-axis. A single monolayer of gallium arsenide is one atomic layer of gallium and one atomic layer of arsenic with a total thickness of one monolayer being about 2.8 angstroms. Since gallium controls the growth of gallium arsenide film on the substrate, an excess of arsenic is used since excess arsenic will not be detrimental. The amount of gallium deposited on the substrate must be closely controlled because gallium will grow on another atom of gallium whereas arsenic will not grow on another atom of arsenic.

Gallium at room temperature is almost a liquid and for that reason, it is kept in a refrigerator so it would be a solid. In a solid state, gallium is silvery or metallic in color. It is placed in a ceramic crucible and then into the molecular beam epitaxy oven where it is heated to about 1000° C. to vaporize it. The shutter on the gallium furnace keeps gallium vapors confined to the furnace. When the shutter is opened, gallium vapor issues from the furnace and is directed onto the substrate.

Arsenic is solid at room temperature and is silvery or metallic in color. Arsenic, like gallium, is placed in a ceramic crucible and then into a furnace in the molecular beam epitaxy apparatus. Vaporization of arsenic can be attained by heating it to about 300° C. A higher arsenic vaporization temperature than the 300° C. is used in order to have an excess amount of arsenic for deposition beyond what is necessary for a stoichiometric compound of gallium arsenide (GaAs). By using higher arsenic deposition temperature, more arsenic is made available for deposition since the flux curves for arsenic show that flux increases monotonically with the oven temperature.

Deposition of amorphous gallium arsenide on a single crystal gallium arsenide substrate is commenced by simultaneously opening shutters to the gallium and arsenic furnaces although the shutters can be opened and closed one at a time to deposit separate or sequential layers of gallium and arsenic.

The substrate temperature determines whether amorphous or crystalline gallium arsenide will be formed. By limiting the substrate temperature to below about 215° C., preferably in the range of about 100°–200° C., amorphous gallium arsenide is formed.

Annealing of amorphous gallium arsenide, however made, can be accomplished in a separate apparatus where the atmosphere is a forming gas, or non-reactive. Forming gas atmosphere can be about 90% nitrogen and about 10% hydrogen, on volume basis. Pressure in the annealing apparatus is about atmospheric or slightly higher. Conversion of amorphous to single crystal gallium arsenide can be accomplished in the annealing apparatus at an elevated temperature maintained for the duration necessary to obtain single crystal gallium arsenide. In this annealing or heat treatment, a lower anneal temperature will require longer to obtain conversion from the amorphous to the crystalline state. A higher anneal temperature will achieve the desired conversion in a shorter period of time. In converting amorphous gallium arsenide to the single crystal state, anneal temperature should be in the approximate range of 500°–1500° C., preferably about 600°–1000° C. Anneal duration will be in the approximate range of 1 second to 10 hours, preferably about 1 minute to about one hour.

Whereas there is a great improvement in conductivity when gallium arsenide is converted from amorphous to single crystal phase, there is only a modest improvement in conductivity of polycrystalline gallium arsenide. Because of the poor electrical properties, polycrystalline gallium arsenide is almost never used in device applications.

The very high conductivity of the annealed low range gallium arsenide compared to conductivities of the mid range and the high range gallium arsenide is believed to be due at least partly to the fact that during the anneal, additional arsenic atoms replace some of the gallium atoms in the lattice structure of gallium arsenide. Since a gallium atom has three electrons in its outer shell and an arsenic atom has five electrons in its outer shell, replacement of gallium by arsenic is accompanied by a net gain of two electrons per replaced atom. This gain translates into increased conductivity.

The conductivity of the annealed low range and mid range gallium arsenide also appears to be affected by arsenic precipitation whereas the high range gallium arsenide does not appear to have any detectable arsenic precipitation. It has been observed that arsenic precipitation is higher in the mid range gallium arsenide than in the low range gallium arsenide. Precipitation in the mid range material, however, is dispersed throughout the material whereas in the annealed low range gallium arsenide, arsenic precipitation appears to be confined to a narrow interface between the substrate and the grown gallium arsenide, i.e., confined to the outer or the lower surface of the grown gallium arsenide adjacent to the substrate. Volume fraction of precipitated arsenic in the annealed low range gallium arsenide is in the approximate range of 0.001–0.5% preferably in the range of about 0.05–0.2% and this arsenic precipitation is confined to less than about one half of the compound thickness, preferably to within about one quarter of the thickness, measured from the interface of the grown gallium arsenide with the substrate on which it is deposited. This arsenic precipitation is given for a typical 500 nm thick layer.

The invention having been generally described, the following example is given as a particular embodiment of the invention to demonstrate the practice and advantages thereof. It is understood that the example is given by way of illustration and is not intended to limit the specification or the claims that follow, in any manner.

EXAMPLE

This example demonstrates preparation of the low range or amorphous gallium arsenide and its subsequent annealing to convert it to a highly conductive, single crystal phase.

Amorphous gallium arsenide film was grown in a VG V80H molecular beam epitaxy apparatus on a substrate with an indium-free mount operated at a base pressure of about $10^{-10}$ Torr. The gallium furnace temperature was 1056° C. and the arsenic furnace temperature was 302° C. The flux gauge indicated $3.6 \times 10^{-7}$ Torr pressure for gallium and $6.6 \times 10^{-6}$ Torr for arsenic, which is indicative of a gallium to arsenic pressure ratio of 1:18 at the substrate. The shutters on the furnaces were opened simultaneously to deposit amorphous gallium arsenide at a rate of 1 micron per hour on a single crystal gallium arsenide substrate maintained at 190° C. Amorphous gallium arsenide 0.5 micron thick was deposited on the substrate which was previously degreased and etched in $7H_2SO_4:1H_2O: 1H_2O_2$ solution and desorbed of its oxygen layer at substrate temperature of 580° C. The substrate was one quarter of a 7.5 cm wafer with a thickness of about 500 microns. The block on which the substrate was mounted was circular and made of molybdenum about 1 cm thick and about 7.5 cm in diameter. The substrate temperature of 190° C. was the temperature of the thermocouple connected to the backside of the substrate. This gallium arsenide film was amorphous, as indicated by the transmission electron microscope (TEM) diffraction pattern.

After the growth of amorphous gallium arsenide was stopped, the power to the heater was shut-off, allowing the film to cool to about room temperature. This amorphous gallium arsenide had atomic ratio of about 49/51, with excess arsenic.

The sample substrate with one-half micron of grown amorphous gallium arsenide was then transferred to an annealing furnace where the atmosphere was 90% by volume nitrogen and 10% by volume hydrogen and the temperature was 850° C. The sample was kept in the anneal furnace at 850° C. for 10 minutes.

During annealing, the amorphous gallium arsenide film was transformed into a single crystal material, as evidenced by TEM. Its conductivity was 130/ohm-cm, as measured by the Hall technique. Arsenic precipitates were found at the interface with the substrate. The epilayer of grown gallium arsenide was 500 nm and the arsenic precipitates appeared in about the first 100 nm from the interface. The volume fraction of the precipitates was 0.02%, based on the entire epilayer. In the first 100 nm from the interface, the volume fraction of the arsenic precipitates was 0.1%. The single crystal, high conductivity gallium arsenide was not the stoichiometric 50/50 atomic ratio gallium arsenide but a non-stoichiometric gallium arsenide of approximate atomic ratio of 49/51, with excess arsenic.

The sample produced herein was used as the n-type layer in a diode which operated as a conventional diode.

For comparison purposes, the conductivity of the low range single crystal gallium arsenide was about 130/ohm-cm (as given above), that of undoped mid range gallium arsenide is about $1 \times 10^{-6}$/ohm-cm, and that of undoped high range gallium arsenide is a $6 \times 10^3$/ohm-cm. For semiconductors, conductivity of about 130/ohm-cm is considered to be relatively high and desirable for certain applications.

Many modifications and variations of the present invention are possible in light of the above teachings. It is, therefore, to be understood that within the scope of the appended claims, the invention may be practiced otherwise than as specifically described herein.

What is claimed is:

1. A process for preparing a crystalline compound of at least one element selected from Group III-A elements of the Periodic Table and at least one element selected from Group V-A elements of the Periodic Table comprising the steps of (a) vaporizing at least one element of Group III-A, (b) vaporizing at least one element of Group V-A, (c) depositing the vapors of said selected Group III-A and Group V-A elements on a substrate to form an amorphous compound of said at least one element from Group III-A and said at least one element from Group V-A, and (d) heating said amorphous compound at a sufficiently elevated temperature for a sufficient duration to convert the amorphous compound to a single crystal compound.

2. The process of claim 1 wherein said Group III-A elements are selected from the group consisting of aluminum, gallium, indium, thallium, and mixtures thereof and Group V-A elements are selected from the group consisting of phosphorus, arsenic, antimony, bismuth, and mixtures thereof.

3. The process of claim 1 including the step of depositing more of the at least one of the Group V-A elements than at least one of the Group III-A elements on atomic basis, wherein said Group III-A elements are selected from the group consisting of aluminum, gallium, and mixtures thereof and said Group V-A elements are selected from the group consisting of arsenic, antimony, and mixtures thereof.

4. The process of claim 3 wherein the compound is single crystal gallium arsenide containing more than a stoichiometric amount of arsenic, on atomic basis, said step of heating is carried out at a temperature in the range of about 500°–1500° C., for a duration in the range of about 1 second to 10 hours and said step of depositing is carried out on a single crystal gallium arsenide substrate.

5. The process of claim 4 wherein said step of heating is carried out at a temperature in the range of about 600°–1000° C. for about 1 minute to about 1 hour.

6. In a process for converting an amorphous compound disposed on a single crystal gallium arsenide substrate to a single crystal compound, comprising the step of heating an amorphous compound composed of at least one element selected from Group III-A elements of the Periodic Table and at least one element selected from Group V-A elements of the Periodic Table, at an elevated temperature until the amorphous compound is converted to a single crystal compound.

7. The process of claim 6 wherein said Group III-A elements are selected from the group consisting of aluminum, gallium, and mixtures thereof and said Group V-A elements are selected from the group consisting of arsenic, antimony, and mixtures thereof.

8. The process of claim 7 wherein the amorphous compound is gallium arsenide prepared by vaporizing gallium and arsenic and depositing vaporized gallium and arsenic at essentially vacuum at a rate of about 0.5–5 microns/hour on a single crystal gallium arsenide substrate maintained at a temperature of about 100°–200° C., and said heating step is carried out at a temperature of about 600°–1000° C. for about 1 minute to about 1 hour.

* * * * *